(12) United States Patent
Fang et al.

(10) Patent No.: US 11,031,443 B2
(45) Date of Patent: Jun. 8, 2021

(54) ORGANIC LIGHT-EMITTING DIODE (OLED) DISPLAY DEVICE INCLUDING SENSOR DISPOSED IN GROOVE OF BASE SUBSTRATE

(71) Applicant: WUHAN CHINA STAR OPTOELECTRONICS SEMICONDUCTOR DISPLAY TECHNOLOGY CO., LTD., Hubei (CN)

(72) Inventors: Liang Fang, Hubei (CN); Ding Ding, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 19 days.

(21) Appl. No.: 16/609,488

(22) PCT Filed: May 9, 2019

(86) PCT No.: PCT/CN2019/086276
§ 371 (c)(1),
(2) Date: Oct. 30, 2019

(87) PCT Pub. No.: WO2020/211132
PCT Pub. Date: Oct. 22, 2020

(65) Prior Publication Data
US 2020/0328261 A1    Oct. 15, 2020

(30) Foreign Application Priority Data

Apr. 15, 2019 (CN) .......................... 201910301422.5

(51) Int. Cl.
*H01L 27/32* (2006.01)
*H01L 51/52* (2006.01)
*G06F 1/16* (2006.01)

(52) U.S. Cl.
CPC ........ *H01L 27/3234* (2013.01); *G06F 1/1605* (2013.01); *H01L 27/3276* (2013.01);
(Continued)

(58) Field of Classification Search
None
See application file for complete search history.

(56) References Cited

U.S. PATENT DOCUMENTS 10,163,984 B1 * 12/2018 Ho ........................ G06K 9/2036
2010/0315570 A1 * 12/2010 Mathew ................ G06F 1/1601
349/58

(Continued)

*Primary Examiner* — Erik Kielin
(74) *Attorney, Agent, or Firm* — Mark M. Friedman

(57) ABSTRACT

An organic light-emitting diode (OLED) display device including a display panel and an image capturing assembly, wherein the display panel comprises a base substrate and a display layer. The image capturing assembly comprises a sensor, a signal module, and a lens. The sensor is disposed in a groove of the base substrate, and a height of the sensor is greater than a depth of the groove, and an upper end of the sensor and the signal module extend into the TFT layer. An image capturing signal transmission line electrically connected to the signal module is disposed in the TFT layer. The lens is disposed in an opening of the display layer corresponding above the sensor.

10 Claims, 4 Drawing Sheets

(52) U.S. Cl.
CPC ...... *H01L 51/5246* (2013.01); *H01L 51/5293* (2013.01); *H01L 2251/5338* (2013.01)

(56) References Cited

U.S. PATENT DOCUMENTS

| | | | |
|---|---|---|---|
| 2017/0277219 A1* | 9/2017 | Chung | G06F 1/1637 |
| 2018/0196475 A1* | 7/2018 | Bao | H01L 27/3232 |
| 2019/0080136 A1* | 3/2019 | Wu | H01L 27/3234 |
| 2019/0095672 A1* | 3/2019 | Yeke Yazdandoost | H01L 27/1462 |
| 2019/0373229 A1* | 12/2019 | Zhang | H04N 5/2254 |

* cited by examiner

ORGANIC LIGHT-EMITTING DIODE (OLED) DISPLAY DEVICE INCLUDING SENSOR DISPOSED IN GROOVE OF BASE SUBSTRATE

BACKGROUND OF INVENTION

Field of Invention

The present invention relates to a field of display technology, and in particular, to an OLED display device.

Description of Prior Art

In flat panel display technology, organic light emitting diode (OLED) displays have aroused great interests in the scientific research and industry, and gradually become the third generation display technology after liquid crystal displays (LCD) due to its many excellent features, such as thinness and lightness, active illumination, fast response times, large viewing angles, wide color gamut, high brightness, low power consumption and applicability of flexible screen preparations, etc.

The OLED display device is a self-luminous type display device, and generally includes pixel electrodes and a common electrode respectively serving as an anode and a cathode, and an organic functional layer disposed between the pixel electrodes and the common electrode. An organic light emitting layer usually includes a hole injection layer, a hole transport layer, a light emitting layer, an electron transport layer, and an electron injection layer, which are stacked. The light emitting mechanism is that electrons and holes are driven by a certain voltage to be injected from the cathode and the anode to the electron injection layer and the hole injection layer, respectively. The electrons and holes migrate to the light emitting layer through the electron transport layer and the hole transport layer, respectively, and meet each other in the light emitting layer to form excitons and excite light emitting molecules to emit visible light through radiation relaxation.

At present, an image capturing function is an important function of a terminal device such as a mobile phone. In existing mainstream technology, an image capturing assembly with the image capturing function is designed in a peripheral non-display area of the display device. A major drawback of this design is that the display device has low integration, greatly reducing an effective display area.

Nowadays, designs of "full screen" have become mainstreams of the times. Full screen technology has been used more and more on the screen of mobile phones. At present, all suppliers are focusing on the development of full screen products with relatively high screen-to-body ratios. For example, iPhone X mobile phone uses a notch screen design, which can achieve a screen-to-body ratio of 81.15%. The recently developed under-display camera design is an O-cut screen design. As shown in FIG. 1, a camera is placed in the display panel 100, wherein an active area (AA) of the display screen 100 is divided into an image capturing area (CA), and an "O" shaped slot 500 is cut corresponding to the CA area for placing and exposing the camera. A peripheral area 130 under the screen has a fixed end of an integrated circuit chip (IC) corresponding to a region of the image capturing assembly. The display device adopts a perforated design, and compared with the notch design, the O-cut design is closer to the full screen effect. Therefore, a proportion of the O-cut area occupying the entire panel is much smaller than that of the notch area occupying the entire panel. As such, the advantage of the full screen of O-cut design is more obvious, and has a great advantage in the mobile phone display screen market.

Although the traditional O-cut design can increase an area of the display area to a certain extent, it still has an important defect. As shown in FIG. 2, the assembly of the image capturing assembly 800 and the display screen 100 is performed after they are separately manufactured, and they are relatively independent, which leads to problems that their integration degree cannot be solved perfectly, and size mismatch is easy to occur when they are produced by different manufacturers.

SUMMARY OF INVENTION

An object of the present invention is to provide an organic light-emitting diode (OLED) display device, which can improve a screen-to-body ratio and assemblability of the OLED display device by separately integrating a sensor and a lens of an image capturing assembly into the display panel structure.

To achieve the above object, the present invention provides an organic light-emitting diode (OLED) display device, including a display panel and an image capturing assembly disposed in the display panel, wherein the display panel includes a base substrate and a display layer disposed on the base substrate; the display layer includes a thin film transistor (TFT) layer disposed on the base substrate and an OLED functional layer disposed on the TFT layer; the display panel is divided into a display area, an image capturing area located in the display area, and a peripheral area located outside the display area; the image capturing assembly includes a sensor, a signal module electrically connected to the sensor and disposed on a side of an upper end of the sensor, and a lens disposed above the sensor; a groove configured to accommodate the sensor is disposed at a surface of the base substrate close to the display layer and corresponding to the image capturing area; the sensor is disposed in the groove of the base substrate, and a height of the sensor is greater than a depth of the groove, and the upper end of the sensor and the signal module are located in the TFT layer; an opening corresponding to the image capturing area is provided through the display layer configured to receive the lens; the lens is disposed in the opening; and the TFT layer includes a first metal layer and a plurality of inorganic layers, and an image capturing signal transmission line electrically connected to the signal module is disposed in the first metal layer.

At least one signal connection pad configured to be electrically connected to the sensor and the image signal transmission line is disposed at a surface of the signal module, the inorganic layers between the signal connection pad and the first metal layer is provided with a connection hole above the signal connection pad, and the image capturing signal transmission line is connected to the signal connection pad through the connection hole.

The peripheral area is provided with an image capturing signal input area, and the image capturing signal transmission line extends along an edge of the display area from the image capturing area to the image capturing signal input area.

The first metal layer is a source/drain metal layer.

The first metal layer is a gate metal layer.

The TFT layer further includes a second metal layer spaced apart from the first metal layer by the inorganic layers.

The first metal layer and the second metal layer are respectively either one of a source/drain metal layer or a gate metal layer.

The gate metal layer and the source/drain metal layer are sequentially disposed on the base substrate from bottom to top, or the source/drain metal layer and the gate metal layer are sequentially disposed on the substrate from bottom to top.

The opening is further filled with a light transmissive glue.

The sensor located in the groove is connected to the base substrate by an adhesive layer.

The base substrate is a flexible substrate.

The display layer further includes a polarizing layer disposed on the OLED functional layer.

Advantageous effects of the present invention: The present invention provides an organic light-emitting diode (OLED) display device including a display panel and an image capturing assembly, wherein the display panel includes a base substrate and a display layer, the image capturing assembly includes a sensor, a signal module, and a lens; the sensor is disposed in a groove of the base substrate, and a height of the sensor is greater than a depth of the groove, and the upper end of the sensor and the signal module are extended into the TFT layer, an image capturing signal transmission line electrically connected to the signal module is disposed in the TFT layer; the lens is disposed in an opening of the display layer corresponding above the sensor. The present invention improves the integration degree between the display panel and the image capturing assembly in the manufacturing process of assembling the image capturing assembly in the display panel, by separately integrating the sensor and the lens of the image capturing assembly into the display panel structure, which avoids the matching problem between the image capturing assembly and the display panel produced by different manufacturers to a certain extent. In addition, the base substrate adopts a groove design in the image capturing area to build in the sensor in the substrate, avoiding problems such as image capturing blur caused by poor light transmittance of the polyimide (PI) substrate on the image capturing assembly of a conventional design. Further, by using metal trace in the TFT layer structure as the image signal transmission line, process complexity caused by external leads can be optimized to a certain extent.

In order to further understand the features and technical contents of the present invention, please refer to the following detailed description and drawings related to the present invention. The drawings are provided for purposes of illustration and description only, and are not intended to limit the present invention.

BRIEF DESCRIPTION OF DRAWINGS

The technical solutions and advantageous effects of the present invention will be apparent from the following detailed description of embodiments of the present invention with reference to the drawings.

In the drawings.

DETAILED DESCRIPTION OF PREFERRED EMBODIMENTS

In order to further clarify the technical means and effects of the present invention, the following detailed description will be made in conjunction with the preferred embodiments and the accompanying drawings of the present invention.

Figure 1:
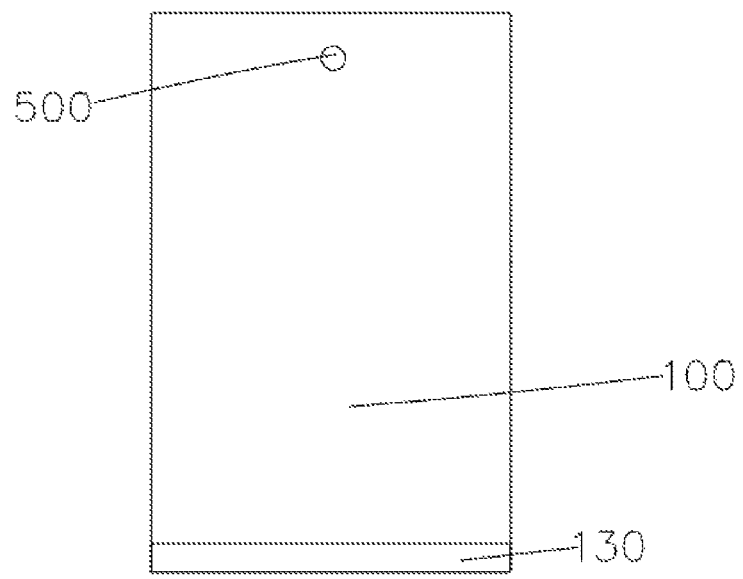
FIG. 1 is a schematic diagram of setting a camera in a display area of a display screen of a mobile phone.
Figure 2:
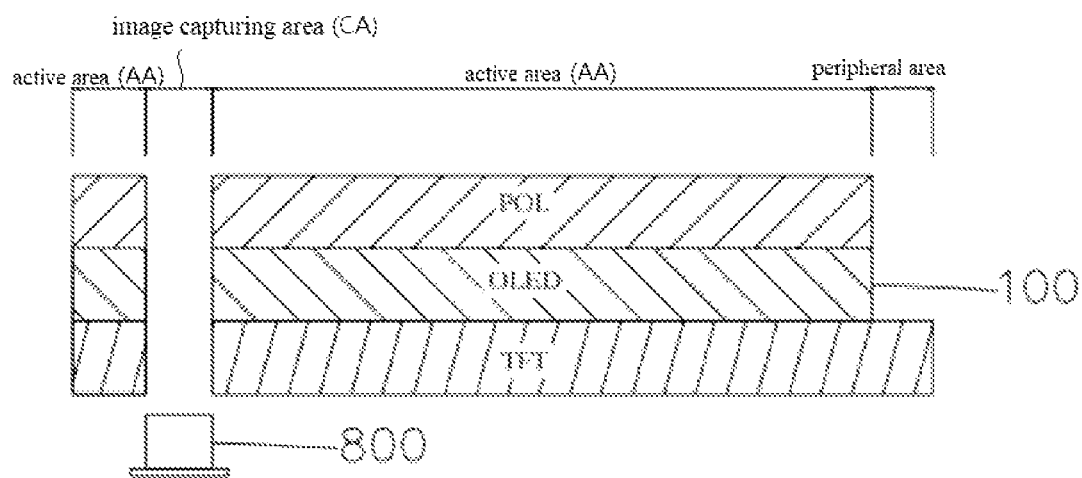
FIG. 2 is a schematic view of an image capturing assembly and a display screen of a conventional OLED display device before assembly.
Figure 3:
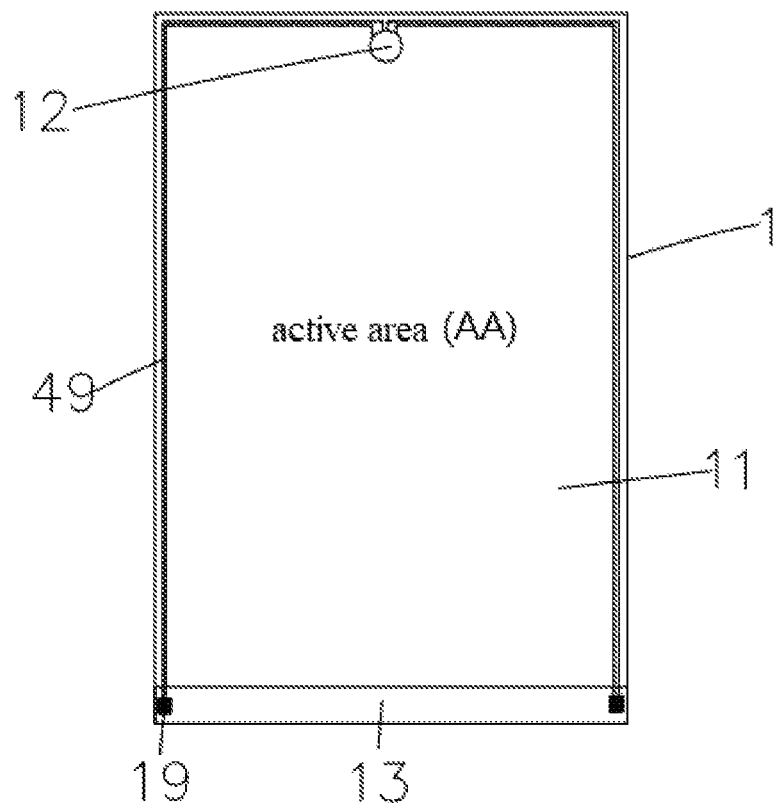
FIG. 3 is a schematic plan view of an OLED display device of the present invention.

Referring to FIG. 3, an organic light-emitting diode (OLED) display device according to the first embodiment of the present invention includes a display panel 1 and an image capturing assembly 9 disposed in the display panel 1.

The display panel 1 includes a base substrate 2 and a display layer 3 provided on the base substrate 2.

The display layer 3 includes a thin film transistor (TFT) layer 4 disposed on the base substrate 2, an OLED functional layer 5 disposed on the TFT layer 4, a thin film encapsulation layer sequentially disposed on the OLED functional layer 5 (not shown) and polarizing layer (POL) 6.

The display panel 1 is divided into a display area 11, an image capturing area 12 located in the display area 11, and a peripheral area 13 located outside the display area 11.

Figure 4:
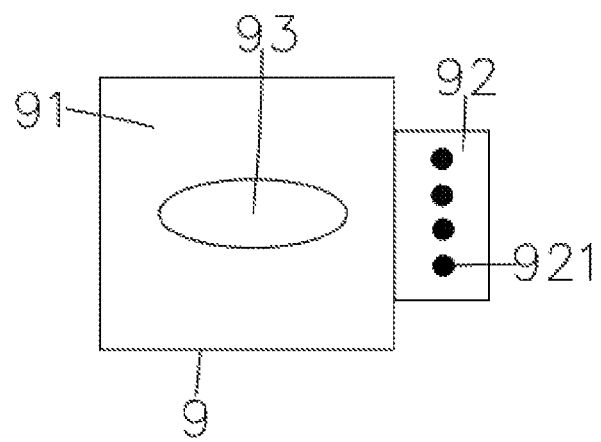
FIG. 4 is a schematic top view of an image capturing assembly in an OLED display device of the present invention.
Figure 5:
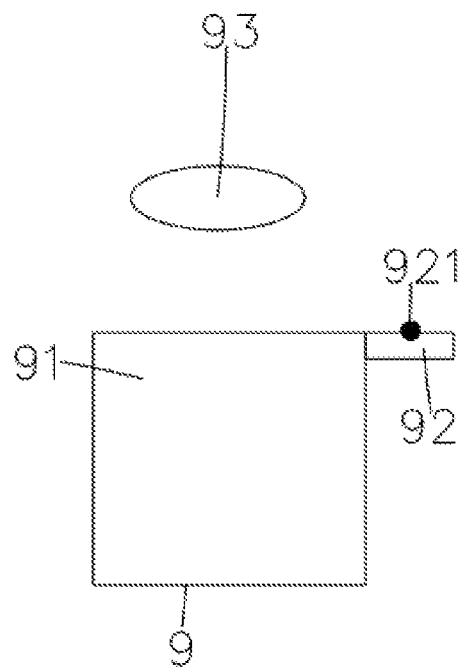
FIG. 5 is a schematic side view of an image capturing assembly in an OLED display device of the present invention.

As shown in FIGS. 4-5, the image capturing assembly 9 mainly includes a sensor 91, a signal module 92 electrically connected to the sensor 91 disposed on a side of an upper end of the sensor 91, and a lens 93 disposed above the sensor 91.

Figure 6:
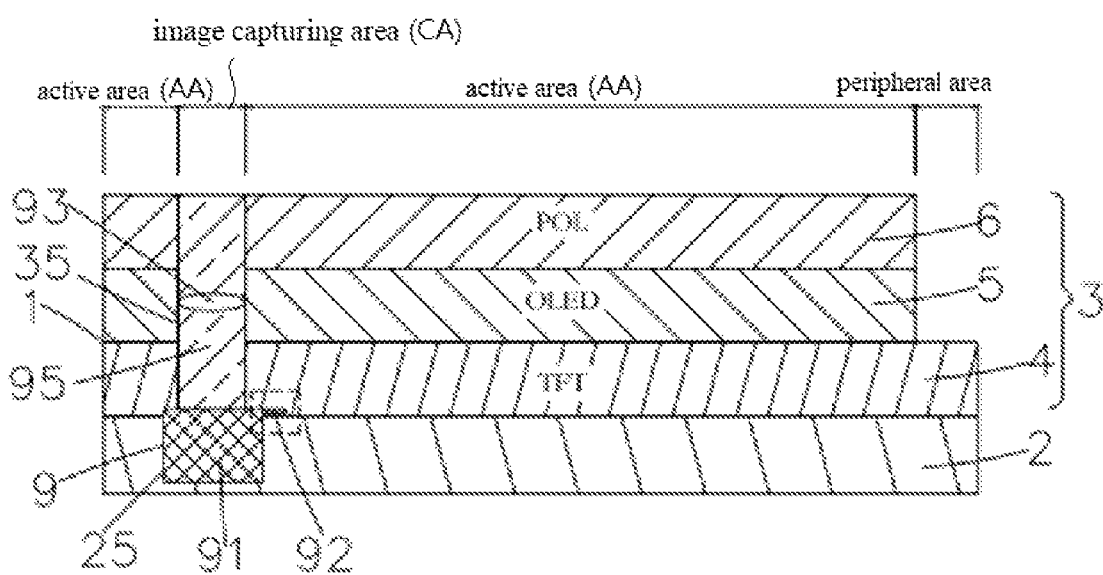
FIG. 6 is a schematic cross-sectional view of an OLED display device of the present invention.

Specifically, as shown in FIG. 6, a surface of the base substrate 2 close to the display layer 3 is provided with a groove 25 configured to accommodate the sensor 91 corresponding to the image capturing area 12, the sensor 91 is disposed in the groove 25 of the base substrate 2, and a height of the sensor 91 is greater than a depth of the groove 25. An upper end of the sensor 91 and the signal module 92 are located in the TFT layer 4. The display layer 3 is provided with an opening 35 configured to accommodate the lens 93 through the display layer 3 corresponding to the image capturing area 12, and the lens 93 is disposed in the opening 35.

Specifically, the TFT layer 4 includes a first metal layer 41, a second metal layer 42, and a plurality of inorganic layers 43, which are stacked, wherein the first metal layer 41 and the second metal layer 42 are spaced apart from each other, the first metal layer 41 and the second metal layer 42 are respectively either one of a source/drain metal layer or a gate metal layer, and the first metal layer 41 is provided with an image capturing signal transmission line 49 electrically connected to the signal module 92.

Specifically, at least one signal connection pad 921 configured to be electrically connected to the sensor 91 and the image signal transmission line 49 is disposed at a surface of the signal module 92, the inorganic layers 43 between the signal connection pad 921 and the first metal layer 41 is provided with a connection hole 45 above the signal connection pad 921, and the image capturing signal transmission line 49 is connected to the signal connection pad 921 through the connection hole 45.

Specifically, the peripheral area 13 is arranged at one side of the display area 11, and the image capturing area 12 is arranged at an edge of the display area 11 away from the side of the peripheral area 13. Of course, the display area 11, the image capturing area 12, and the peripheral area 13 may also be arranged in other manners, and are not limited to the above arrangement.

Specifically, the peripheral area 13 is provided with an image capturing signal input area 19, and the image capturing signal transmission line 49 extends along an edge of the display area 11 from the image capturing area 12 to the image capturing signal input area 19.

Figure 7:
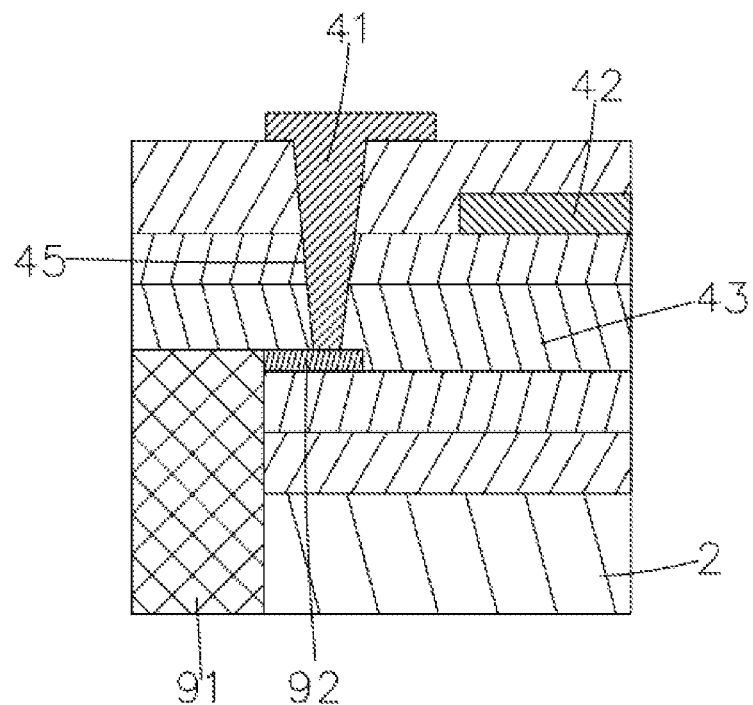
FIG. 7 is an enlarged schematic view showing a region indicated by a square in FIG. 6 of the OLED display device according to the first embodiment of the present invention.

Specifically, as shown in FIG. 7, in this embodiment, the gate metal layer and the source/drain metal layers are sequentially disposed on the base substrate 2 from bottom to top, and the first metal layer 41 is a source/drain metal layer.

Specifically, the opening 35 is further filled with a light transmissive glue 95, and a height of the lens 93 in the opening 35 can be adjusted. Further, the height of the lens 93 can be adjusted by changing a thickness of the light transmissive glue 95 between the lens 93 and the sensor 91 and a thickness of the light transmissive glue 95 above the lens 93.

Specifically, the sensor 91 located in the groove 25 is connected to the base substrate 2 by an adhesive layer, so that the sensor 91 is fastened on the base substrate 2.

Specifically, the base substrate 2 is a flexible substrate, and more preferably a polyimide (PI) substrate.

Specifically, the base substrate 2 may have a single layered structure or a multilayered structure.

Specifically, the OLED functional layer 5 includes a first electrode layer (not shown) disposed on the TFT layer 4, a pixel defining layer disposed on the TFT layer 4 and the first electrode layer, and an organic functional layer (not shown) disposed on the first electrode layer and the pixel defining layer and a second electrode layer (not shown) disposed on the organic functional layer and the pixel defining layer.

Specifically, the first electrode layer and the second electrode layer are an anode layer and a cathode layer, respectively, and the organic functional layer includes a hole injection layer, a hole transport layer, a light emitting layer, an electron transport layer, and an electron injection layer (not shown), which are stacked from bottom to top.

The OLED display device according to the first embodiment of the present invention includes a display panel 1 and an image capturing assembly 9, wherein the display panel 1 includes a base substrate 2 and a display layer 3, the image capturing assembly 9 includes a sensor 91, a signal module 92, and a lens 93; the sensor 91 is disposed in a groove 25 of the base substrate 2, and a height of the sensor 91 is greater than a depth of the groove 25, and the upper end of the sensor 91 and the signal module 92 are extended into the TFT layer 4, an image capturing signal transmission line electrically connected to the signal module is disposed in the TFT layer 4; the lens 93 is disposed in an opening 35 of the display layer 3 corresponding above the sensor 91. The present invention improves the integration degree between the display panel 1 and the image capturing assembly 9 in the manufacturing process of assembling the image capturing assembly 9 in the display panel, by separately integrating the sensor 91 and the lens 93 of the image capturing assembly 9 into a structure of the display panel 1, which avoids the matching problem between the image capturing assembly 9 and the display panel 1 produced by different manufacturers to a certain extent. In addition, the base substrate 2 adopts a groove design in the image capturing area 12 to build in the sensor 91 on the substrate, avoiding problems such as image capturing blur caused by poor light transmittance of the polyimide (PI) substrate on the image capturing assembly 9 of a conventional design. Further, the source/drain metal layer in the TFT layer 4 is provided with an image capturing signal transmission line electrically connected to the signal module. The lens 93 is disposed in the opening 35 of the display layer 3 corresponding to the sensor 91.

Figure 8:
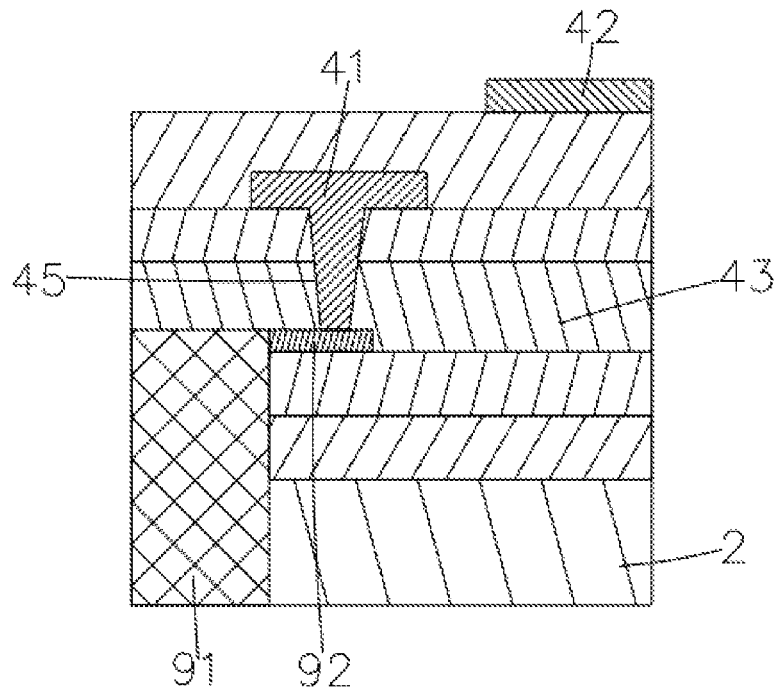
FIG. 8 is an enlarged schematic view showing a region indicated by a square in FIG. 6 of the OLED display device according to the second embodiment of the present invention.

Referring to FIG. 8, a second embodiment of the OLED display device of the present invention is different from the first embodiment described above in that the first metal layer 41 is a gate metal layer. Other technical features are the same as those of the first embodiment described above, and are not described herein again.

The second embodiment of the present invention provides an organic light-emitting diode (OLED) display device, which improves the integration degree between the display panel and the image capturing assembly in the manufacturing process of assembling the image capturing assembly 9 in the display panel 1, by separately integrating the sensor 91 and the lens 93 of the image capturing assembly 9 into a structure of the display panell, which avoids the matching problem between the image capturing assembly 9 and the display panel 1 produced by different manufacturers to a certain extent. In addition, the base substrate 2 adopts a groove design in the image capturing area 12 to build in the sensor 91 on the substrate, avoiding problems such as image capturing blur caused by poor light transmittance of the polyimide (PI) substrate on the image capturing assembly 9 of a conventional design. Further, the source/drain metal layer in the TFT layer 4 is provided with an image capturing signal transmission line electrically connected to the signal module. The lens 93 is disposed in the opening 35 of the display layer 3 corresponding to the sensor 91.

In summary, the present invention provides an organic light-emitting diode (OLED) display device including a display panel and an image capturing assembly, wherein the display panel includes a base substrate and a display layer, the image capturing assembly includes a sensor, a signal module, and a lens; the sensor is disposed in a groove of the base substrate, and a height of the sensor is greater than a depth of the groove, and the upper end of the sensor and the signal module are extended into the TFT layer, an image capturing signal transmission line electrically connected to the signal module is disposed in the TFT layer; the lens is disposed in an opening of the display layer corresponding above the sensor. The present invention improves the integration degree between the display panel and the image capturing assembly in the manufacturing process of assembling the image capturing assembly in the display panel, by separately integrating the sensor and the lens of the image capturing assembly into the display panel structure, which avoids the matching problem between the image capturing assembly and the display panel produced by different manufacturers to a certain extent. In addition, the base substrate adopts a groove design in the image capturing area to build in the sensor in the substrate, avoiding problems such as image capturing blur caused by poor light transmittance of the polyimide (PI) substrate on the image capturing assembly of a conventional design. Further, by using metal trace in the TFT layer structure as the image signal transmission line, process complexity caused by external leads can be optimized to a certain extent.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display device, comprising a display panel and an image capturing assembly disposed in the display panel, wherein
the display panel comprises a base substrate and a display layer disposed on the base substrate;
the display layer comprises a thin film transistor (TFT) layer disposed on the base substrate and an OLED functional layer disposed on the TFT layer;
the display panel is divided into a display area, an image capturing area located in the display area, and a peripheral area located outside the display area;
the image capturing assembly comprises a sensor, a signal module electrically connected to the sensor and disposed on a side of an upper end of the sensor, and a lens disposed above the sensor;
a groove configured to accommodate the sensor is disposed at a surface of the base substrate close to the display layer and corresponding to the image capturing area;
the sensor is disposed in the groove of the base substrate, and a height of the sensor is greater than a depth of the groove, and the upper end of the sensor and the signal module are located in the TFT layer;
an opening corresponding to the image capturing area is provided through the display layer configured to receive the lens;
the lens is disposed in the opening; and
the TFT layer comprises a first metal layer and a plurality of inorganic layers, and an image capturing signal transmission line electrically connected to the signal module is disposed in the first metal layer.

2. The OLED display device according to claim 1, wherein at least one signal connection pad configured to be electrically connected to the sensor and the image signal transmission line is disposed at a surface of the signal module, the inorganic layers between the signal connection pad and the first metal layer is provided with a connection hole above the signal connection pad, and the image capturing signal transmission line is connected to the signal connection pad through the connection hole.

3. The OLED display device according to claim 1, wherein the peripheral area is provided with an image capturing signal input area, and the image capturing signal transmission line extends along an edge of the display area from the image capturing area to the image capturing signal input area.

4. The OLED display device according to claim 1, wherein the first metal layer is a source/drain metal layer.

5. The OLED display device according to claim 1, wherein the first metal layer is a gate metal layer.

6. The OLED display device according to claim 1, wherein the TFT layer further comprises a second metal layer spaced apart from the first metal layer by the inorganic layers,
the first metal layer and the second metal layer are respectively either one of a source/drain metal layer or a gate metal layer, and
the gate metal layer and the source/drain metal layer are sequentially disposed on the base substrate from bottom to top, or the source/drain metal layer and the gate metal layer are sequentially disposed on the substrate from bottom to top.

7. The OLED display device according to claim 1, wherein the opening is further filled with a light transmissive glue.

8. The OLED display device according to claim 1, wherein the sensor located in the groove is connected to the base substrate by an adhesive layer.

9. The OLED display device according to claim 1, wherein the base substrate is a flexible substrate.

10. The OLED display device according to claim 1, wherein the display layer further comprises a polarizing layer disposed on the OLED functional layer.

* * * * *